United States Patent [19]

Shirai et al.

[11] Patent Number: 5,023,407

[45] Date of Patent: Jun. 11, 1991

[54] PRINTED CIRCUIT BOARD WITH A UNIFORM CONDUCTIVE LAYER FORMED BY EQUALIZATION OF METALS THEREIN

[75] Inventors: Mitugu Shirai; Kaoru Katayama; Hideaki Sasaki; Shinichi Kazui, all of Hadano; Ryohei Satoh; Tateoki Miyauchi, both of Yokohama; Mamoru Kobayashi, Hadano, all of Japan

[73] Assignee: Hitachi, Ltd., Tokyo, Japan

[21] Appl. No.: 390,616

[22] Filed: Aug. 7, 1989

[30] Foreign Application Priority Data

Aug. 30, 1988 [JP] Japan .................. 63-215680

[51] Int. Cl.$^5$ .................. H05K 1/09
[52] U.S. Cl. .................. 174/257; 174/259; 174/261
[58] Field of Search .................. 174/257, 259, 261

[56] References Cited

U.S. PATENT DOCUMENTS

| | | | |
|---|---|---|---|
| 4,268,585 | 5/1981 | Daur et al. ................... | 174/261 |
| 4,434,544 | 3/1984 | Dohya et al. .................. | 427/125 X |
| 4,521,476 | 6/1985 | Asai et al. ...................... | 174/261 X |
| 4,597,029 | 6/1986 | Kuoharek et al. ............ | 357/82 X |
| 4,620,264 | 10/1986 | Ushifusa et al. ............. | 174/261 X |
| 4,681,656 | 7/1987 | Byrum ........................... | 156/252 X |
| 4,737,839 | 4/1988 | Burt .............................. | 357/67 R |
| 4,785,137 | 11/1988 | Samuels ........................ | 420/441 X |
| 4,786,523 | 11/1988 | Dohya .......................... | 361/402 X |

FOREIGN PATENT DOCUMENTS 62-256961 11/1987 Japan .
63-97382 4/1988 Japan .

Primary Examiner—Morris H. Nimmo
Attorney, Agent, or Firm—Fay, Sharpe, Beall, Fagan, Minnich & McKee

[57] ABSTRACT

A metal layer other than gold is formed on a ceramic substrate, a gold layer is further formed on said metal layer, and then a high density beam is applied to the treated substrate member. Thereby, the metal of the underlayer diffused through the grain boundaries of gold up to the surface of the gold layer by heat treatment or the like is uniformly mixed with gold to form an alloyed layer excellent in wettability to a solder. At the same time, nonmetallic impurities such as carbon adhering onto the surface of the gold layer are melted and removed.

16 Claims, 8 Drawing Sheets

A SECTION EXPOSED TO LASER BEAM

A SECTION UNEXPOSED TO LASER BEAM

X1000, ACCELERATION VOLTAGE 3KV

30 μm

X10000, ACCELERATION VOLTAGE 3KV 3.0 μm

X15300, ACCELERATION VOLTAGE 15KV 2.00 μm

ADHERENCE OF CARBON

X5000, ACCELERATION VOLTAGE 3KV

X10000,
ACCELERATION VOLTAGE 3KV

PRINTED CIRCUIT BOARD WITH A UNIFORM CONDUCTIVE LAYER FORMED BY EQUALIZATION OF METALS THEREIN

BACKGROUND OF THE INVENTION

The present invention relates to a method for equalization of metal surfaces, especially the equalization of metals to enable cleaning of the surface of a substrate member to be soldered at a low cost.

In order to obtain a good condition for a soldering junction, it is necessary to mutually diffuse atoms between a material for connection or a material to be connected (or to be soldered) (hereinafter referred to as a substrate member) and a solder. In addition, for obtaining an excellent spreadability of a solder, it is important to offer a sufficient amount of heat as well as to clean the surface of a substrate member.

For this purpose, a method for removing oxides from the surface of a substrate member prior to soldering has been adopted. The method involves a chemical reaction using an organic acid having a reducing power, namely a so-called fluxing agent.

In the case where the removal of contamination can not be accomplished by a chemical reaction using a fluxing agent only, a method of removing oxides from the surface using an acid such as hydrochloric acid, such or sulfuric acid, ammonium persulfate, selected in accordance with the kind of the substrate member, or a method for mechanically removing the contamination using sandpaper, a brush or the like, are generally adopted.

There has been known a method (grazing) for obtaining a material composed of a superfine homogenous structure or an amorphous structure excellent in corrosion resistance, abrasion resistance, etc. by rapidly scanning laser beams to a metal material. A steel material, carbide or the like is proposed. This grazing method is considered to be applicable for treating a metallic material (for example a material for a turbine engine or a turbo-charger of an automobile) which is to be exposed to a high temperature atmosphere under a high pressure.

The working method using laser beams is explained in "ZOKU-LASER KAKOH (Continuation Laser Working)" p. 164 (written by Akira Kobayashi, published by KAIHATSUSHA) for instance. Other publications relating to this kind of technology are available in Japanese Patent Unexamined Publication Nos. 63-97382, 62-256961, etc..

In the prior arts abovementioned, the substrate member is chemically treated with an acid or the like before soldering. In this regard, it is necessary to sufficiently clarify the surface of the substrate member in advance of soldering. There is, however, the problem that the potential of corrosion is usually high due to the remaining acid.

It is also necessary to dry the surface of the substrate member after washing it with water. In this washing step, the surface of the substrate member is likely to be reoxidized.

Said chemical method exhibits an effect to remove oxides and contaminants from the surface of the substrate member. However, it can not be expected to reform the surface of the substrate member for improving the wettability to a solder or to make the surface into the state excellent in resistance to oxidation. Besides, a poor condition between a plated layer and a base can not be improved or taken out, although the surface condition of the plating layer or the like is cleaned. Furthermore, facilities requiring a large amount of investment and a large number of treating steps are necessary to actually carry out the aforementioned method.

SUMMARY OF THE INVENTION

An object of the present invention is to eliminate the problems aforementioned.

Another object is to provide a method for the equalization of metals which can obtain excellent wettability at a low cost by reforming metals with use of optical beams.

According to the invention, the aforementioned objects are achieved by providing a method for the equalization of metals wherein a metal layer other than gold is formed on the surface of a substrate, a gold layer is further formed on said metal layer, and a high density beam is applied to said gold layer so as to reform the layer into a uniformly alloyed layer composed of the metal other than gold and gold, and excellent in wettability to a solder and bonding connectability.

According to the present invention, the surface of a material to be soldered or a substrate member is instantaneously melted by the irradiation of high-density energy beams and resolidified by self cooling mass. By this treatment, the surface of the substrate member is reformed, into the state exhibiting an excellent wettability to a solder, according to the reasons as follows:

(1) Various kinds of substances formed on the surface and its vicinity of the substrate member by plating, sintering (heat treatment), etc. are melted, so as to form a uniformly alloyed layer excellent in wettability.

(2) Water, organic substances, etc. adhering onto the surface of a substrate member during processing are gasified to preparatively remove vapours of organic substances which would be formed by heat during soldering, so that a dense metal layer can be formed.

(3) Since melting and resolidification are instantaneously performed, the possibility that the surface of the substrate member will be oxidized is suppressed.

Moreover, owing to the evaporation of the surface of the substrate member by the instantaneous irradiation of the high-density energy beam, the effects undermentioned as (4) and (5) are exhibited.

(4) Organic substances such as carbonaceous material adhering onto the surface of the substrate member are instantaneously evaporated.

(5) By enlarging the power of heating, metal oxides harmful to wettability are evaporated themselves, so that a clarified metal layer can be obtained.

DESCRIPTION OF THE PREFERRED EMBODIMENTS

Preferred embodiments of the present invention will become apparant by the following description with reference to the drawings accompanied.

Figure 2:
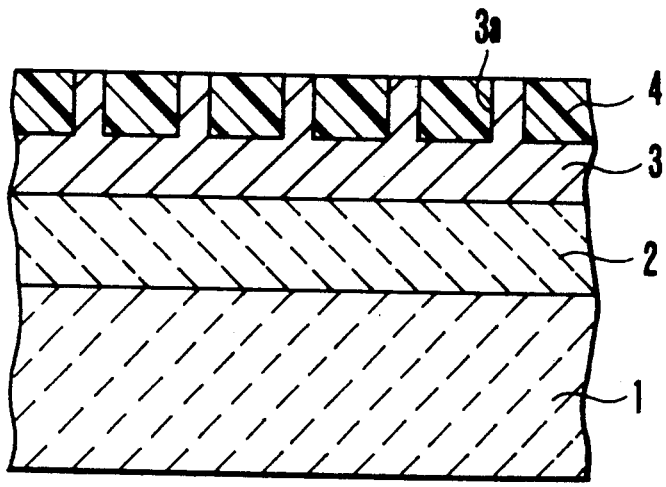
FIG. 2 is an illustration for showing the appearance of the surface of a substrate member before treated in said embodiment according to the present invention.

Referring to FIG. 2 which shows the appearance of the surface of a substrate member before being treated, the substrate member in this embodiment is composed of a ceramic substrate 1 such as alumina, a conductive layer 2 such as tungsten or copper, a nickel (Ni) layer 3 and a gold (Au) layer 4. Said conductive layer 2 acts as one end portion of a circuit pattern part provided on the surface 1, and forms a junction along with the nickel layer 3 and the gold layer 4. This kind of substrate member having a circuit pattern part and a junction part constitutes a circuit board as a whole.

Figure 3:
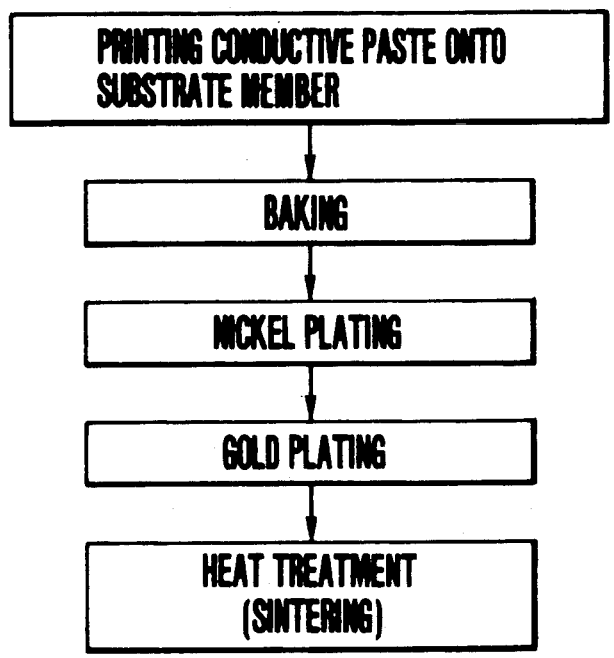
FIG. 3 is a flow chart showing the process of manufacturing a substrate member.

Referring to FIG. 3 which shows the process of manufacturing a substrate member, a high-melting point metal such as tungsten or molybdenum are printed onto the surface of the substrate 1 before being baked, and then baked to form a conductive layer 2. Thereafter, a nickel layer 3 and a gold layer 4 are applied onto said conductive layer 2 by an ordinary plating method.

In order to improve the bonding strength between the conductive layer 2 and the nickel layer 3 and between the nickel layer 3 and the gold layer 4, the plated substrate is generally subjected to heat treatment which is so-called sintering. During this sintering, nickel atoms in the nickel layer 3 formed on the conductive layer 2 are diffused in to the gold layer 4 by heating. The diffusion speed of nickel atoms especially through the grain boundaries of the gold layer 4 is very high, so that nickel atoms 3a themselves can move up to the surface of the gold layer 4. Consequently, the surface layer consisting of a spinodal structure comprising a part of the Au-rich gold layer alloyed with the diffused nickel atoms and a part of the Ni-rich nickel layer alloyed with gold is formed on the substrate member or the circuit board.

Figure 1:
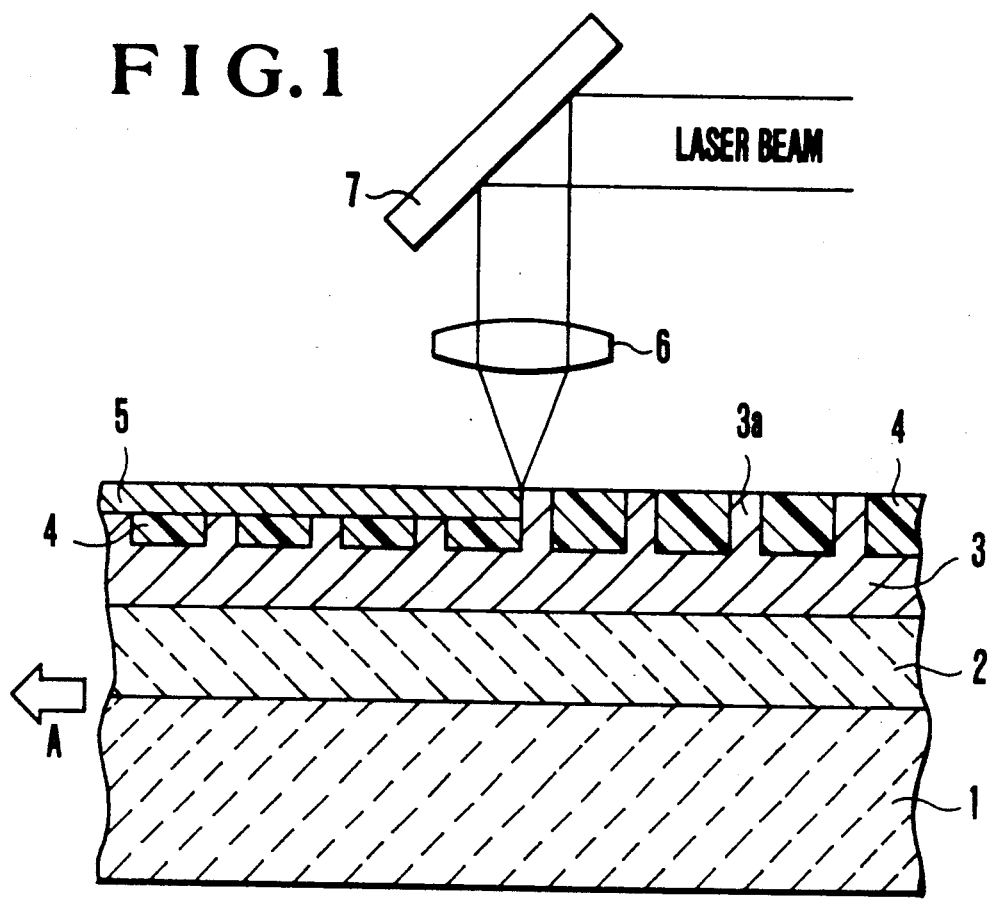
FIG. 1 is a conceptive illustration for explaining the reformation of a gold layer in an embodiment according to the present invention.

Referring to FIG. 1 for explaining the reformation of the gold surface in the embodiment of the present invention, a laser beam is applied through a laser reflector plate 7 and a condenser lens 6 to the surface of the substrate member as shown in FIG. 2, to perform the reformation of the surface. In this case, the substrate member is carried along the arrow A direction by a proper XY table (not shown), while being exposed to the irradiation of a laser beam. Consequently, the area which has been exposed to the irradiation of laser beams is instantaneously heated, so that nickel 3a in the gold layer 4 and the gold layer 4 are melted and formed into a uniformly alloyed nickel-gold (NiAu) layer 5.

In an example, the thickness of the nickel layer 3 applied onto the conductive layer 2 was 5 $\mu$m, the thickness of the gold layer 4 was 3 $\mu$m, and the heat treatment after plating was continued 10 minutes at 750° C.

The wave length of laser beam applied was 308 nm, and obtained by an excimer laser. The wave length and power of said laser beam is selected in compliance with the thicknesses of the gold layer 4 and the nickel layer 3, and the patterns, configurations and lay-outs of these layers. In actual, the appropriate values of the wave length and the power were noticed in the ranges of 150-1100 nm and 0.5-5 J/cm$^2$, respectively. The pitch of pulses of laser beam was preferably controlled to 1 $\mu$s or shorter.

In prior arts, nickel atoms 3a diffused into the gold layer 4 by sintering exhibit an unfavorable effects to impede the spreadability of a solder, resulting in the formation of a poor junction. According to the reformation of the surface of the gold layer in the embodiment of the present invention, nickel atoms 3a and gold atoms in the gold layer 4 were instantaneously melted and resolidified by the energy of the beam. As a result, nickel atoms 3a were dissolved in the gold layer 4 so as to form the uniformly alloyed Ni-Au layer 5 containing a small amount of nickel. Owing to this alloyed layer 5, the wettability of the treated surface to a solder is improved to a large extent.

In case where the discharge power of the laser beam is too large, nickel atoms 3a would be evaporated and readhered onto the surface of the gold layer 4, resulting in the deterioration of the wettability to a solder. The power of the laser beam is needed to be high enough to melt only the surface and its vicinity of the gold layer 4. The wettability to a solder would be deteriorated when the melting reaction reaches the nickel layer 3 itself.

In the aforementioned embodiment, the nickel layer 3 was formed by plating. However, the formation of the nickel layer is not restricted by said plating, but may also be performed by the other metal film forming methods, to exhibit the same effects.

Figure 4:
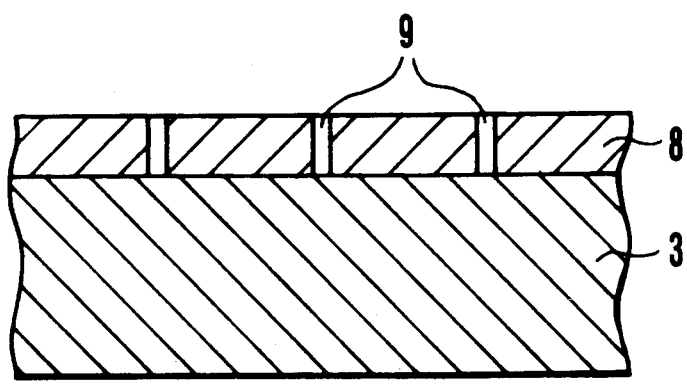
FIG. 4 is an illustration for showing the appearance of pinholes which have been formed by applying a thin plating layer onto the surface of a substrate member.

In addition, the countermeasures to the precipitation of nickel atoms to the surface of the gold layer which would be harmful to the wettability to a solder are not limited to the diffusion by the heat treating step. For instance, in case where a gold layer 8 adhering onto the surface is so thin as shown in FIG. 4 to expose the nickel layer 3 to the surface due to the formation of pinholes 9, a uniformly alloyed gold-nickel layer effective in the wettability is formed in the same manner. Nickel atoms diffused onto the surface of the gold layer due to letting-alone for a long period can also be melted by the surface reforming method in this embodiment, to recover the wettability.

The underlayer for the gold plating is not especially limited to nickel, as far as metal comprising said underlayer exhibits excellent connecting property to the gold layer. For instance, the same effect can be obtained, by using cobalt plating instead of nickel plating adopted in this embodiment.

Figure 5:
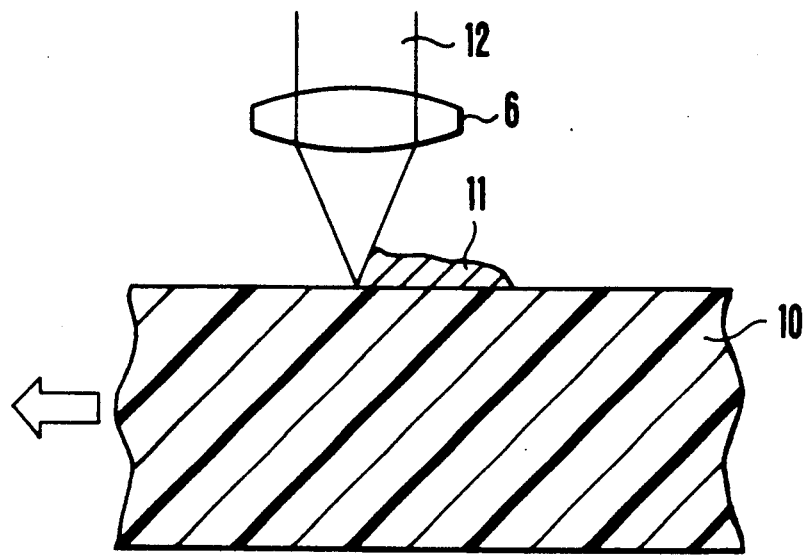
FIG. 5 is an illustration for explaining an example for the of the organic substances, etc..

Nonmetallic contaminants such as carbon 11 adhering onto the surface of the substrate member 10 are also instantaneously removed from the surface by the irradiation of laser beams 12 as shown in FIG. 5. Consequently, when a solder is spread in a molten state onto the surface, the formation of voids and other defects which would be caused by said contamination is eliminated.

Figure 6:
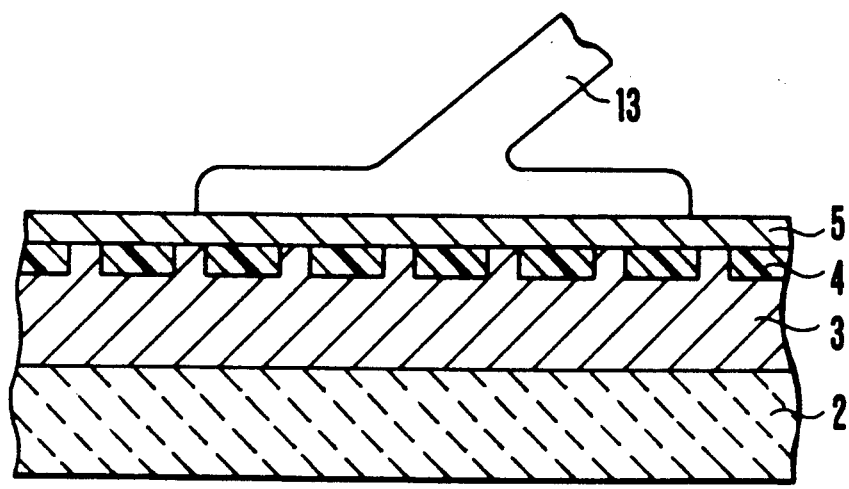
FIG. 6 is an illustration for explaining the situation that a gold wire is bonded to a substrate member.

The formation of the alloyed layer 5 by the laser treatment as aforementioned is useful not only for preparing the surface excellent in solderability, but also for improving the strength of junction when a gold wire is bonded to said alloyed layer 5. Referring to FIG. 6 for explaining this situation, when a gold wire 13 is connected onto the alloyed layer 5 by wire bonding, excellent junction can be obtained.

Figure 7A:
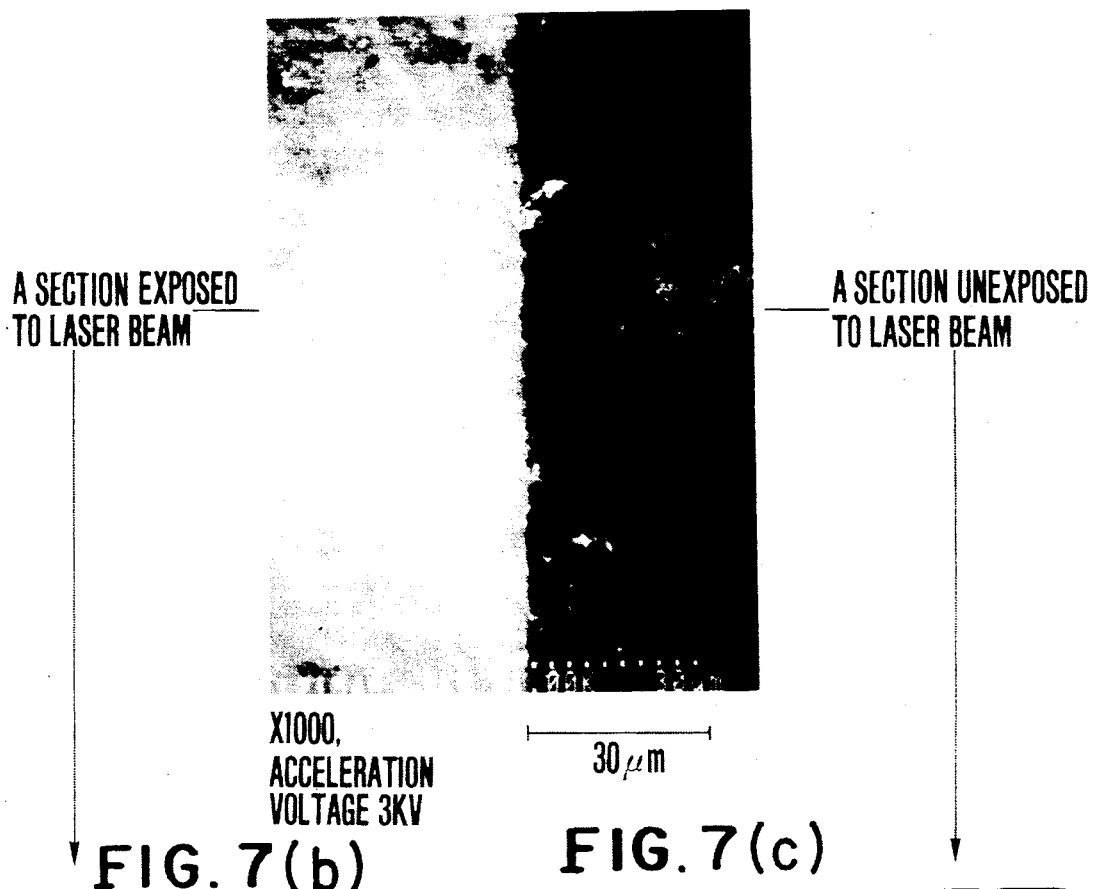
FIGS. 7a, 7b and 7c are scanning electron photomicrographs for showing the appearance of the surface of a substrate member after exposed to the irradiation of an excimer laser beam, in comparison with that of a substrate member which is not exposed to the irradiation of the same laser beam.
Figure 7B:
Figure 7C:

According to the embodiment of the present invention, by applying a laser beam having short wave length onto the surface of a substrate member to be soldered, only the surface part of the substrate member is instantaneously melted and resolidified as shown in FIG. 7a, 7b and 7c so that substances which would exhibit a harmful influence on the wettability to a solder can be changed into an alloy excellent in wettability. Consequently, the wettability of the treated surface to a solder becomes 2.7 times higher as compared with that of the surface part which is not exposed to the irradiation of a laser beam.

Figure 8A:
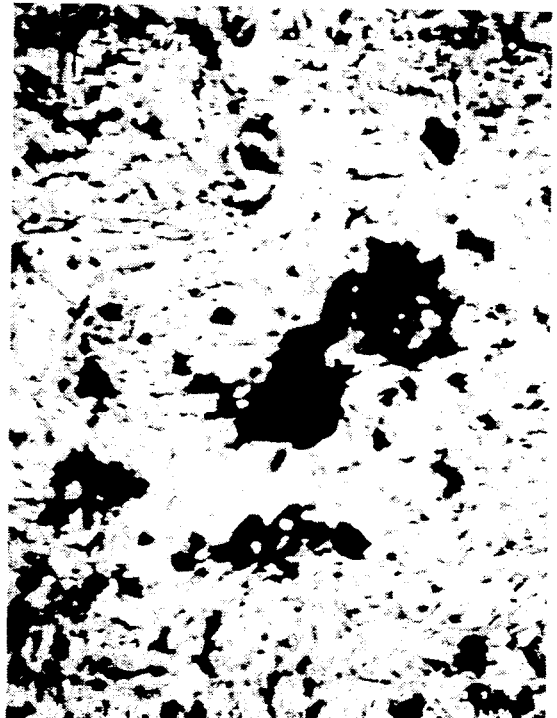
FIG. 8(a) is a scanning electron photomicrograph for showing the appearance of carbon adhering onto the surface of substrate member.
Figure 8B:
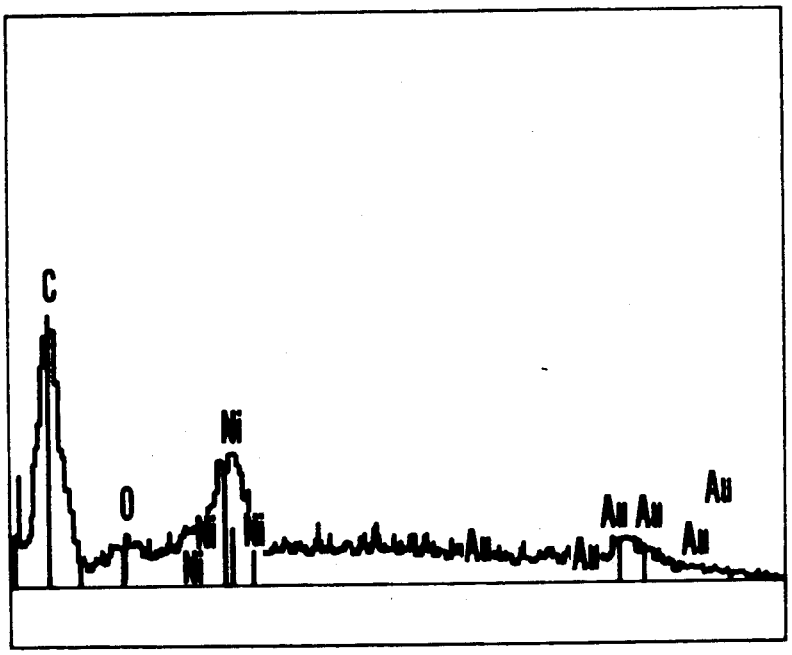
FIG. 8(b) is an analysis diagram for showing the existence of carbon.
Figure 9A:
FIG. 9(a) is a scanning electron photomicrograph for showing the appearance of the surface of a substrate member after exposed to the irradiation of laser beam.
Figure 9B:
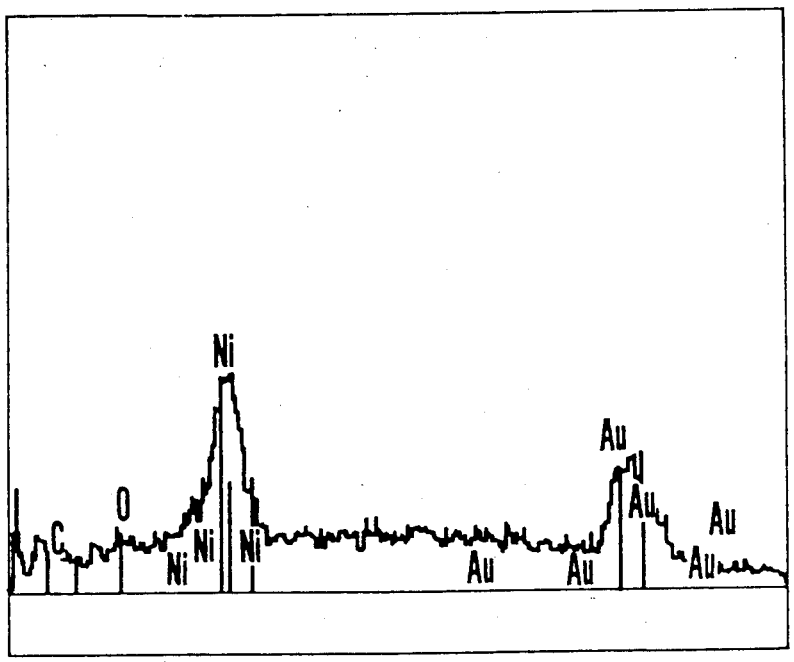
FIG. 9(b) is an analysis diagram for explaining the removal of carbon.

FIG. 8(a) is a photomicrograph for showing the appearance that carbon 11 adheres onto the surface of the substrate member 10, while FIG. 8(b) shows the result of the X-ray analysis of the substrate member under said condition. The abscissas of FIG. 8(b) shows the energy (KeV) of secondary electrons discharged from the surface of the substrate member 10, while the ordinate axis shows its intensity. According to this drawing, it is noticed that carbon (C) adheres onto the surface of the substrate member. When the laser working as aforementioned is applied onto said substrate member 10, carbon 11 is removed as shown in FIG. 9(a). The result of X-ray analysis as shown in FIG. 9(b) demonstrates the absence of carbon (C) on the surface of the substrate member.

What is claimed is:

1. A circuit board, comprising:
   a substrate; and
   a junction pad or zone provided on the substrate and having a uniformly alloyed layer of gold and a metal other than gold at least on a surface or the junction pad or zone, said uniformly alloyed layer formed by melting and resolidifiying a non-uniform layer of gold and a metal other than gold, the junction pad or zone being an area suited for bonding with an external wire element.

2. A circuit board as claimed in claim 1, wherein said junction part is a soldering pad or zone.

3. A circuit board as claimed in claim 1, wherein said junction part is a wire bonding pad or zone.

4. A circuit board as claimed in claim 1, wherein said substrate is a ceramic substrate.

5. A circuit board as claimed in claim 1, wherein said metal other than gold is a metal containing nickel excellent in connecting property to gold as a main component.

6. A circuit board, comprising:
   a substrate; and
   a junction part provided on the substrate, said junction part including a layer of plated gold and a uniformly alloyed layer of comprising gold and a metal other than gold at least on a surface of the layer of plated gold, said uniformly alloyed layer formed by instantaneously melting and resolidifiying a non-uniform layer of gold and a metal other than gold, the junction part being an area suited for bonding with an external wire element.

7. A circuit board as claimed in claim 6, wherein said junction part is a soldering part.

8. A circuit board as claimed in claim 6, wherein said junction part is a wire bonding part.

9. A circuit board as claimed in claim 7, wherein said substrate is a ceramic substrate.

10. A circuit board as claimed in claim 7, wherein said metal other than gold is a metal containing nickel or the like excellent in connecting property to gold as a main component.

11. A circuit board, comprising:
    a substrate;
    a circuit pattern part provided on the substrate; and
    a junction part formed at a predetermined portion of said circuit pattern part, wherein said junction part is an area suited for bonding with an external wire element and comprises a gold layer and a connecting layer for connecting said gold layer to said circuit pattern part, said gold layer having a uniformly alloyed layer of gold and a metal precipitated from said connecting layer formed by melting and resolidifing by laser beam irradiation at least on the surface.

12. A circuit board as claimed in claim 11, wherein said junction part is a soldering part.

13. A circuit board as claimed in claim 11, wherein said junction part is a wire bonding part.

14. A circuit board as claimed in claim 11, wherein said substrate is a ceramic substrate.

15. A circuit board as claimed in claim 11, wherein a metal for said connecting layer contains nickel or the like excellent in connecting property to gold as a main component.

16. A circuit board as claimed in claim 11, wherein a metal for said circuit part contains at least one selected from tungsten and copper as a main component.

* * * * *